United States Patent
Lin

(10) Patent No.: US 8,966,930 B2
(45) Date of Patent: Mar. 3, 2015

(54) CONTAINER DATA CENTER SYSTEM

(75) Inventor: Tai-Wei Lin, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 584 days.

(21) Appl. No.: 13/214,234

(22) Filed: Aug. 22, 2011

(65) Prior Publication Data

US 2013/0008197 A1 Jan. 10, 2013

(30) Foreign Application Priority Data

Jul. 7, 2011 (TW) .............................. 100124123 A

(51) Int. Cl.
- *F25D 11/02* (2006.01)
- *H05K 7/14* (2006.01)
- *H05K 7/20* (2006.01)

(52) U.S. Cl.
CPC .......... *H05K 7/1497* (2013.01); *H05K 7/20745* (2013.01); *H05K 7/20836* (2013.01)
USPC .................. 62/441; 62/175; 62/186; 62/132; 62/259.2; 236/1 B

(58) Field of Classification Search
CPC .................. F25B 7/00; F24F 1/00; F24F 1/06
USPC .......... 62/186, 132, 259.2, 175, 441; 236/1 B
See application file for complete search history.

(56) References Cited

U.S. PATENT DOCUMENTS

| | | | | |
|---|---|---|---|---|
| 3,865,181 | A * | 2/1975 | Mori et al. ..................... | 165/212 |
| 5,129,063 | A * | 7/1992 | Sainola et al. ..................... | 710/1 |
| 7,669,433 | B2 * | 3/2010 | Yoon et al. ..................... | 62/231 |
| 8,081,423 | B2 * | 12/2011 | Pereira et al. .................. | 361/676 |
| 8,310,829 | B2 * | 11/2012 | Monk et al. .................... | 361/696 |
| 2004/0031280 | A1 * | 2/2004 | Martin et al. ..................... | 62/246 |
| 2006/0082263 | A1 * | 4/2006 | Rimler et al. .................. | 312/201 |
| 2008/0060372 | A1 * | 3/2008 | Hillis et al. .................. | 62/259.2 |
| 2008/0245086 | A1 * | 10/2008 | Schenkel et al. ............. | 62/228.1 |
| 2008/0285232 | A1 * | 11/2008 | Claassen et al. .............. | 361/694 |
| 2010/0091449 | A1 | 4/2010 | Clidaras et al. | |
| 2010/0110626 | A1 * | 5/2010 | Schmitt et al. ........... | 361/679.47 |

FOREIGN PATENT DOCUMENTS

| | | |
|---|---|---|
| CN | 101277200 A | 10/2008 |
| CN | 201129895 Y | 10/2008 |
| CN | 102014593 A | 4/2011 |
| CN | 201812243 A | 4/2011 |
| TW | M392327 U1 | 11/2010 |
| TW | 201122782 A1 | 7/2011 |

* cited by examiner

*Primary Examiner* — Mohammad M Ali
*Assistant Examiner* — Raheena Rehman
(74) *Attorney, Agent, or Firm* — Novak Druce Connolly Bove + Quigg LLP

(57) ABSTRACT

A container data center system includes a container, a plurality of servers, at least a regulation device, a first refrigeration device and a second refrigeration device. The container defines a first receiving room and a second receiving room isolated from the first receiving room. The servers are received in the first receiving room. The at least a regulation device is received in second receiving room. The at least regulation device is electrically connected to the servers for regulating the servers. The first refrigeration device is installed outside the container for cooling the first receiving room. The second refrigeration device is installed outside the container for cooling the second receiving room.

9 Claims, 4 Drawing Sheets

CONTAINER DATA CENTER SYSTEM

BACKGROUND

1. Technical Field

The present disclosure relates to container data center systems.

2. Description of Related Art

A container data center system usually includes a container, a plurality of servers, at least one regulating device, and a cooling device. The container is hollow and defines a receiving room for receiving the servers and the regulating device. The regulating device is electrically connected to the servers. Users usually regulate the servers with the regulating device. The receiving room is maintained at a certain temperature by the cooling device such that the servers can work normally. However, the servers and the regulating device are in the same receiving room, the temperature is usually too low for the users and makes the users feel uncomfortable in the receiving room.

Therefore, it is desirable to provide a container data center system, which can overcome the limitations described.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
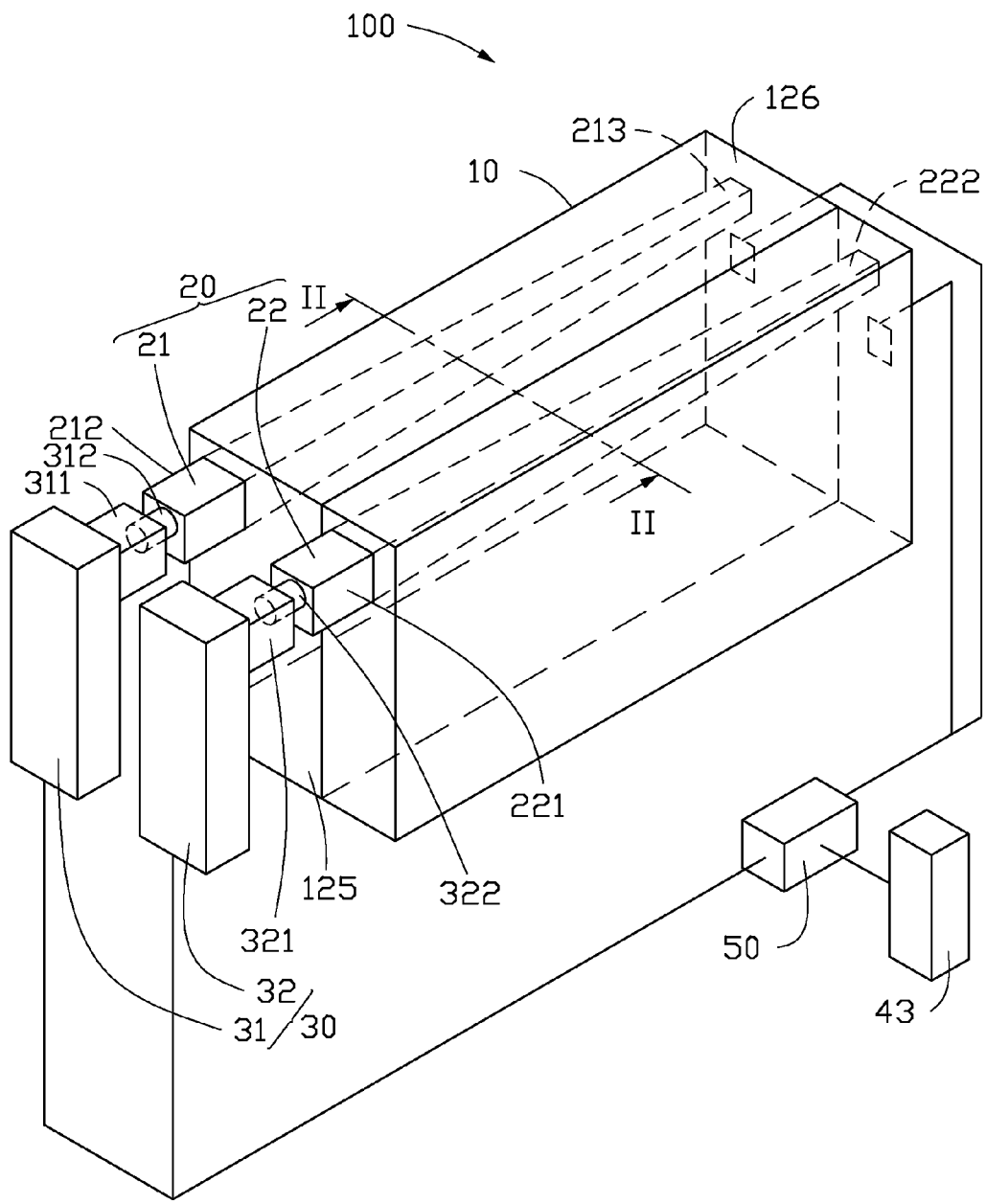
FIG. 1 is an isometric, schematic view of a container data center system according to an exemplary embodiment.
Figure 2:
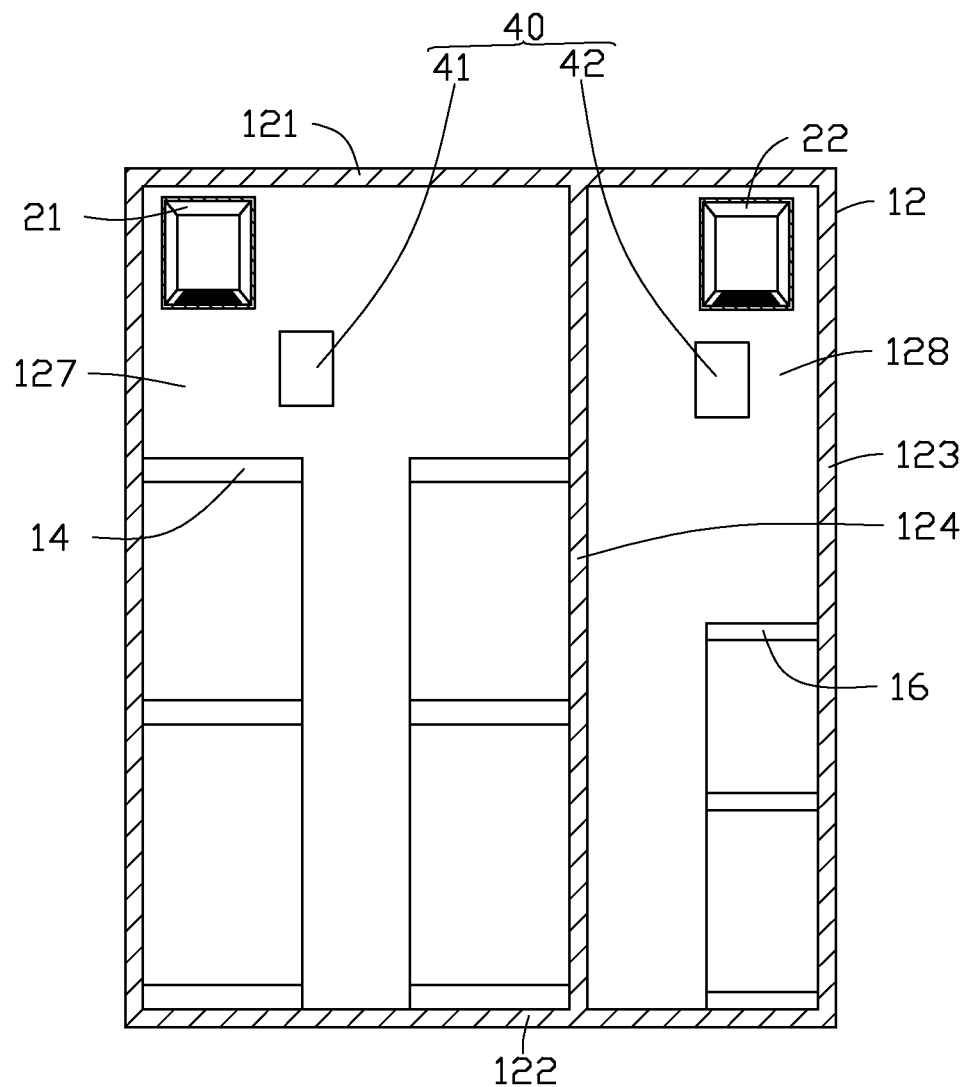
FIG. 2 is a cross-sectional view take along line II-II of FIG. 1.
Figure 3:
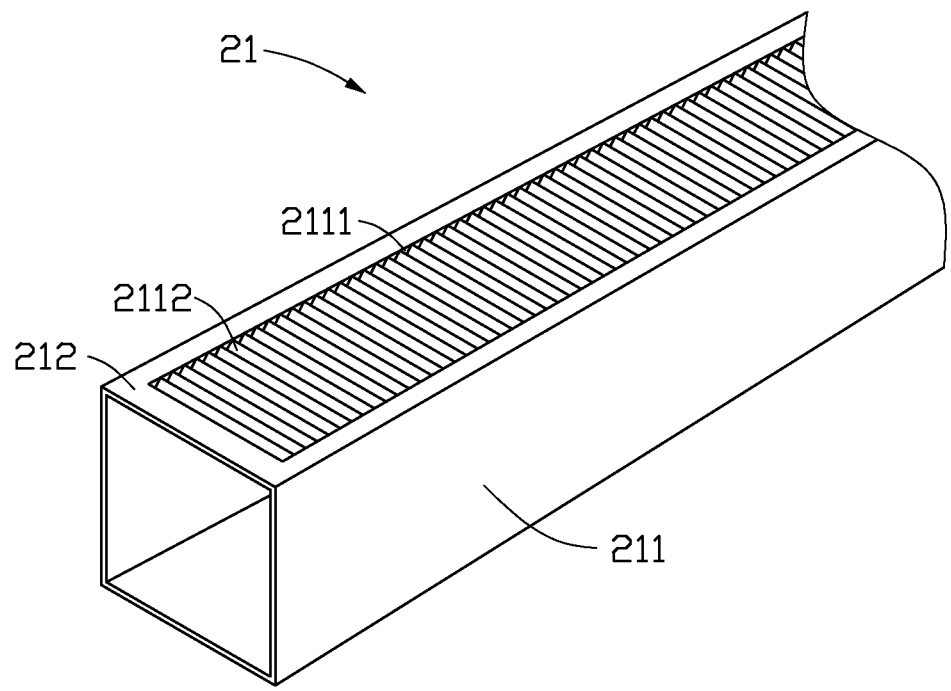
FIG. 3 is an isometric, sectional view of a first airflow guide pipe of the container data center system of FIG. 1.

Referring to FIGS. 1-3, a container data center system 100, according to an exemplary embodiment, includes a container data center 10, an airflow guide pipe assembly 20, a group of refrigeration devices 30, a group of temperature sensors 40, and a control center 50.

The container data center 100 includes a container 12, a plurality of servers 14, and at least one regulation device 16. The container 12 is substantially hollow cuboid and includes a top portion 121, a bottom portion 122 opposite to the top portion 121, a pair of sidewalls 123 parallel to each other and perpendicularly connected between the top portion 121 and the bottom portion 122, a partition plate 124 positioned between the sidewalls 123 and substantially parallel to the sidewalls 123, a front wall 125 perpendicularly connected between the sidewalls 123, and a rear wall 126 opposite to the front wall 125. The container 12 is divided into a first receiving room 127 and a second receiving room 128 isolated from the first receiving room 127 by the partition plate 124. The servers 12 are received in the first receiving room 127. The at least one regulation device 16 is received in the second receiving room 128. The at least one regulation device 16 is electrically connected to the servers 14 for regulating the servers 14. Users can regulate the servers 14 with the regulation device 16.

The airflow guide pipe assembly 20 includes a first airflow guide pipe 21 and a second airflow guide pipe 22 identical with the first airflow guide pipe 21. The first airflow guide pipe 21 is generally a hollow quadrangular frustum pyramid and includes four planar side plates 211 sequentially connected to each other. Each side plate 211 is generally isosceles trapezoid. One of the side plates 211 defines a trapezoid air outlet 2111. A plurality of air leading plates 2112 are mounted in the air outlet 2111. The air leading plates 2112 can be made from metal or plastic. Each air leading plate 2112 is parallel to the others and forms an acute angle relative to the side plate 211 defining the air outlet 2111. The first airflow guide pipe 21 includes a first front end 212 and a first rear end 213. The first airflow guide pipe 21 is tapered from the first front end 212 to the first rear end 213. The second airflow guide pipe 22 includes a second front end 221 and a second rear end 222. The second airflow guide pipe 22 is tapered from the second front end 221 to the second rear end 222. The first airflow guide pipe 21 and the second airflow guide pipe 22 are respectively mounted in the first receiving room 127 and the second receiving room 128 passing through the front wall 125 and adjacent to the top portion 121. The first front end 212 and the second front end 221 are outside the container 12 and adjacent to the front wall 125. The first rear end 213 and the second rear end 222 are mounted to interior surface of the rear wall 126. In alternative embodiments, the first airflow guide pipe 21 and the second airflow guide pipe 22 can be mounted to the interior surface of the top portion 121.

The group of refrigeration devices 30 includes a first refrigeration device 31 and a second refrigeration device 32. The first refrigeration device 31 and the second refrigeration device 32 are installed outside the container 12 adjacent to the front wall 125 and respectively correspond to the first airflow guide pipe 21 and the second airflow guide pipe 22. The first refrigeration device 31 and the second refrigeration device 32 are air conditioners for generating cool air and are electrically connected the control center 50. The first refrigeration device 31 includes a first airflow transmission pipe 311 and a first control switch 312. The first airflow transmission pipe 311 is aligned with the first front end 211. The first control switch 312 is mounted between the first airflow transmission pipe 311 and the first front end 211. The first control switch 312 is an electromagnetic relay. When the first control switch 312 is switched on or switched off, the first airflow transmission pipe 311 is connected to or disconnected from the first front end 211. The second refrigeration device 32 includes a second airflow transmission pipe 321 aligned with the second front end 221 and a second control switch 322. The second control switch 322 is mounted between the second airflow transmission pipe 321 and the second front end 221. When the second control switch 322 is switched on or switched off, the second airflow transmission pipe 321 is connected to or disconnected from the second front end 221. The second control switch 322 is also an electromagnetic relay.

The group of temperature sensors 40 includes a first temperature sensor 41, a second temperature sensor 42, and a third temperature sensor 43. The first temperature sensor 41 and the second temperature sensor 42 are mounted on the interior surface of the rear wall 126 and electrically connected to the control center 50. The first temperature sensor 41 and the second temperature sensor 42 are respectively mounted in the first receiving room 127 and the second receiving room 128. The first temperature sensor 41 and the second temperature sensor respectively measure a first temperature of the first receiving room 127 and a second temperature of the second receiving room 128. The third temperature sensor 43 is installed outside the container 12 and electrically connected to the control center 50. The third temperature sensor 43 measures an outdoor temperature of the outside of the container 12.

Figure 4:
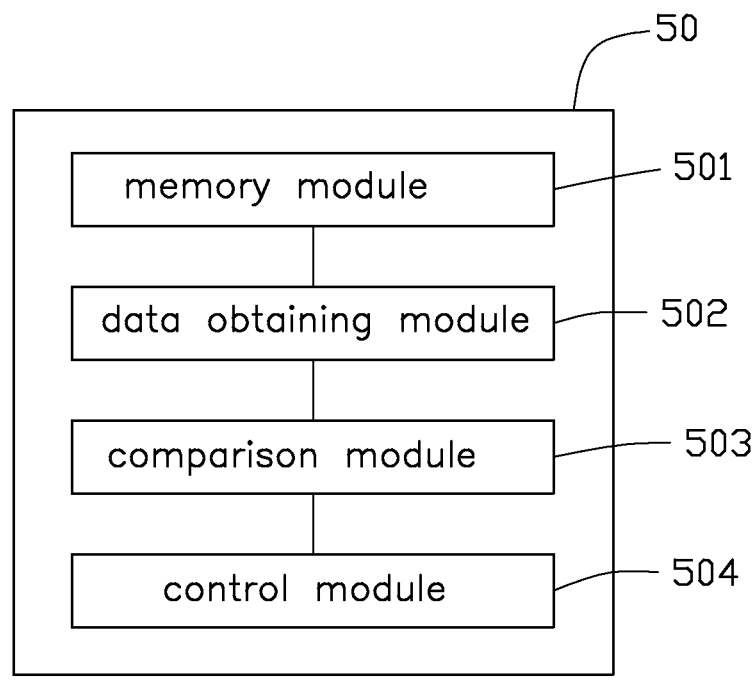
FIG. 4 is a functional block diagram of a control center of the container data center system of FIG. 1.

Referring to FIGS. 1 and 4, the control center 50 is installed outside the container 12 and includes a memory module 501, a data obtaining module 502, a comparison module 503, and a control module 504. The memory module 501 stores a first temperature threshold and a second temperature threshold. The data obtaining module 502 obtains the first temperature, the second temperature, and the outdoor temperature. The comparison module 503 compares if the first temperature is greater than the first temperature threshold, if the second temperature is greater than the second temperature, if the outdoor temperature is greater than the first temperature threshold, and if the outdoor temperature is greater than the second temperature threshold. The control module 504 turns on or turns off the first refrigeration device 31 and the second refrigeration device 32, and further switches on or switches off the first control switch 312 and the second control switch 322.

In use, the data obtaining module 502 obtains the first temperature, the second temperature, and the outdoor temperature respectively from the first temperature sensor 41, the second temperature sensor 42, and the third temperature sensor 43. The comparison module 503 compares if the first temperature is greater than the first temperature threshold and if the outdoor temperature is greater than the first temperature threshold. When the first temperature and the outdoor temperature are both greater than the first temperature threshold (for example, the first temperature is 26 degrees centigrade, the outdoor temperature is 25 degrees centigrade, and the first temperature threshold is 22 degrees centigrade). The control module 504 controls the first refrigeration 31 to turn on and the first control switch 312 to switch on. The first refrigeration 31 generates cool air. The first airflow transmission pipe 311 is connected to the first front end 212 by the first control switch 312 such that the first airflow transmission pipe 311 communicates with the first front end 212. The cool air generated by the first refrigeration 31 is transmitted into the first receiving room 127 through the first airflow transmission pipe 311 and the first airflow guide pipe 21 to cool the first receiving room 127 to maintain a temperature of the first receiving room 127 at about the first temperature threshold. When the first temperature is greater than the first temperature threshold and the outdoor temperature is less than the first temperature threshold (for example, the first temperature is 26 degrees centigrade, the outdoor temperature is 20 degrees centigrade, and the first temperature threshold is 22 degrees centigrade). The control module 504 controls the first refrigeration 31 to turn off and the first control switch 312 to switch off. The first airflow transmission pipe 311 is disconnected to the first front end 212 by the first control switch 312. The first receiving room 127 communicates with the outside of the container 12 through the first airflow guide pipe 21 and cooled by the air outside the container 12.

On the other hand, the comparison module 503 compares if the second temperature is greater than the second temperature threshold and if the outdoor temperature is greater than the second temperature threshold. When the second temperature and the outdoor temperature are both greater than the second temperature threshold (for example, the second temperature is 28 degrees centigrade, the outdoor temperature is 30 degrees centigrade, and the second temperature threshold is 26 degrees centigrade). The control module 504 controls the second refrigeration 32 to turn on and the second control switch 322 to switch on. The second refrigeration 32 generates cool air. The second airflow transmission pipe 321 is connected to the second front end 221 by the second control switch 322 such that the second airflow transmission pipe 321 communicates with the second front end 221. The cool air generated by the second refrigeration 32 is transmitted into the second receiving room 128 through the second airflow transmission pipe 321 and the second airflow guide pipe 22 to maintain a temperature of the receiving room 128 at about the second temperature threshold. When the second temperature is greater than the second temperature threshold and the outdoor temperature is less than the second temperature threshold (for example, the second temperature is 28 degrees centigrade, the outdoor temperature is 24 degrees centigrade, and the first temperature threshold is 26 degrees centigrade). The control module 504 controls the second refrigeration 32 to turn off and the second control switch 322 to switch off. The second airflow transmission pipe 321 is disconnected from the second front end 221 by the second control switch 322. The second receiving room 128 communicates with the outside of the container 12 through the second airflow guide pipe 22 and cooled by the air outside the container 12.

The first temperature threshold and the second temperature threshold are idealized temperatures respectively for the first receiving room 127 and the second receiving room 128. The servers 14 in the first receiving room 127 at about the first temperature threshold can normally work. Users in the second receiving room 128 feel comfortable at about the second temperature threshold. Usually, the first temperature threshold is lower than the second temperature threshold (for example, the first temperature threshold is 22 degrees centigrade and the second temperature threshold is 26 degrees centigrade). The temperatures of the first receiving room 127 and the second receiving room 128 can be respectively controlled to satisfy the servers 14 and the users.

In alternative embodiment, the first airflow guide pipe 21 can be a circular cone or a circular frustum pyramid. The first temperature threshold and the second temperature threshold can be changed by the users.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A container data center system, comprising:
a container defining a first receiving room and a second receiving room isolated from the first receiving room;
a plurality of servers received in the first receiving room;
at least a regulation device received in the second receiving room, the at least regulation device being electrically connected to the servers for regulating the servers;
a first refrigeration device installed outside the container for cooling the first receiving room;
a first temperature sensor measuring a first temperature of the first receiving room;
a second temperature sensor measuring a second temperature of the second receiving room;
a third temperature sensor measuring a outdoor temperature of the outside of container;
a control center electrically connected to the first refrigeration device, the second refrigeration device, the first temperature sensor, the second temperature sensor, and the third temperature sensor; and a second refrigeration device installed outside the container for cooling the second receiving room;

wherein the control center comprises a memory module, a data obtaining module, a comparison module, and a control module, the memory module stores a first temperature threshold and a second temperature threshold, the data obtaining module is configured to obtain the first temperature, the second temperature, and the outdoor temperature, the comparison module is configured to compare if the first temperature is greater than the first temperature threshold and if the outdoor temperature is greater than the first temperature threshold, the control module is configured to turn on the first refrigeration device to generate cool air to the first receiving room when the first temperature and the outdoor temperature are both greater than the first temperature threshold.

2. The container data center system of claim 1, further comprising a first airflow guide pipe, wherein the first airflow guide pipe is partially mounted in the first receiving room, the first airflow guide pipe is a hollow quadrangular frustum pyramid and comprises four planar side plates sequentially connected with each other, each side plate is isosceles trapezoid, one of the side plates defines a trapezoid air outlet, a plurality of air leading plates mounted in the air outlet, each air leading plate is parallel to the others and form an acute angle relative to the side plate defining the air outlet, the first airflow guide pipe comprises a first front end positioned outside the container and a first rear end, the first airflow guide pipe is tapered from the first front end to the first rear end, the first refrigeration device is connected to the first front end.

3. The container data center system of claim 2, wherein the first refrigeration device comprises a first airflow transmission pipe and a first control switch, the first transmitting pipe is aligned with the first front end, the first control switch is mounted between the first airflow transmission pipe and the first front end, the control module is configured to control the first control switch to connect the first airflow transmission pipe to the first front end when the first temperature and the outdoor temperature are both greater than the first temperature threshold.

4. The container data center system of claim 3, wherein the control module is configured to control the first control switch to disconnect the first airflow transmission pipe from the first front end when the first temperature is greater than the first temperature threshold and the outdoor temperature is lower than the first temperature, the first receive room is communicated with the outside of the container through the first airflow guide pipe when the first airflow transmission pipe disconnects from the first front end.

5. The container data center system of claim 3, wherein the first control switch is an electromagnetic relay.

6. The container data center system of claim 2, further comprising a second airflow guide pipe, wherein the second airflow guide pipe is partially mounted in the second receiving room, the second airflow guide pipe comprises a second front end positioned outside the container and a second rear end, the second airflow guide pipe is tapered from the second front end to the second rear end, the second refrigeration device comprises a second airflow transmission pipe and a second control switch, the second airflow transmission pipe is aligned with the second front end, the second control switch is mounted between the second airflow transmission pipe and the second front end, the control module is configured to control the second control switch to connect the second airflow transmission pipe to the second front end when the second temperature and the outdoor temperature are both greater than the second temperature threshold.

7. The container data center system of claim 6, wherein the control module is configured to control the second control switch to disconnect the second airflow transmission pipe from the second front end when the second temperature is greater than the second temperature threshold and the outdoor temperature is lower than the second temperature, the second receive room is communicated with the outside of the container through the second airflow guide pipe when the second airflow transmission pipe disconnects from the second front end.

8. The container data center system of claim 7, wherein the second control switch is an electromagnetic relay.

9. The container data center system of claim 1, wherein the first refrigeration device and the second refrigeration device are air conditioners.

* * * * *